United States Patent [19]
Sunderland

[11] Patent Number: 5,474,815
[45] Date of Patent: Dec. 12, 1995

[54] PRODUCTION OF CARRIERS FOR SURFACE PLASMON RESONANCE

[75] Inventor: Robert F. Sunderland, Berkhamsted, United Kingdom

[73] Assignee: Eastman Kodak Company, Rochester, N.Y.

[21] Appl. No.: 304,320

[22] Filed: Sep. 12, 1994

[30]    Foreign Application Priority Data

Oct. 1, 1993 [GB] United Kingdom ............ 9320310

[51] Int. Cl.⁶ ............................................. H05H 1/24
[52] U.S. Cl. ................. 427/576; 427/123; 427/255.3; 427/376.6
[58] Field of Search ............................ 427/576, 123, 427/255.3, 376.6

[56]            References Cited

U.S. PATENT DOCUMENTS

| | | | |
|---|---|---|---|
| 3,476,594 | 11/1969 | Soderberg | 117/211 |
| 4,226,898 | 10/1980 | Ovshinsky et al. | 427/39 |
| 4,382,101 | 5/1983 | Polak | 427/40 |
| 4,500,409 | 2/1985 | Boys et al. | 204/298 |
| 4,554,537 | 11/1985 | Dick | 340/775 |
| 4,997,278 | 3/1991 | Finlan et al. | 356/128 |
| 5,023,053 | 6/1991 | Finlan | 422/82.05 |
| 5,035,863 | 7/1991 | Finlan | 422/82.05 |
| 5,047,213 | 9/1991 | Finlan et al. | 422/82.11 |
| 5,055,265 | 10/1991 | Finlan | 422/82.05 |
| 5,064,619 | 11/1991 | Finlan | 422/82.05 |
| 5,151,956 | 9/1992 | Bloemer | 385/11 |

FOREIGN PATENT DOCUMENTS

| | | | |
|---|---|---|---|
| 257955 | 3/1988 | European Pat. Off. | G01N 21/84 |
| 92/05426 | 9/1991 | WIPO | G01N 22/55 |

OTHER PUBLICATIONS

Chemical Abstracts, vol. 96, No. 8, 22 Feb. 1982, Columbus Ohio, US; abstract No. 56765c; Ashi Glass 'infrared-reflecting glasses' *abstract* & jp-a-76109843 (Aug. 31, 1981).

Primary Examiner—Benjamin Utech

[57]            ABSTRACT

A carrier useful in surface plasmon resonance, a technique for the analysis of antibodies, is prepared by depositing a silver layer on a treated surface. Such surface has been treated with an oxygen-containing gas to incorporate oxygen ions in the surface.

12 Claims, 1 Drawing Sheet

PRODUCTION OF CARRIERS FOR SURFACE PLASMON RESONANCE

FIELD OF THE INVENTION

This invention relates to a process for the production of carriers for surface plasmon resonance (SPR).

BACKGROUND OF THE INVENTION

Surface plasmon resonance or (SPR) is a technique which can be used in the analysis of antibodies which are deposited on surfaces which have been coated with thin films of metal, in particular thin films of silver. SPR based sensors are discussed in a paper by I. Faulkner, W. R. Flavell, J. Davies, R. F. Sunderland and C. S. Nunnerly: "SPR-based sensors studied by electron energy loss spectroscopy and attenuated total reflection", to be published in *J. Electron Spectroscopy*, 1993. The manner in which a coating is applied to a surface has important consequences for the subsequent properties of that surface in terms of SPR and control of the coating process is important. At present, coating is generally performed by spattering but control is not good. It is important that the films are formed from uniform layers of metal in order to get reproducible SPR. On account of this, improved method for the production of films for SPR are desirable.

In a known process, a film of silver is deposited on a surface which has been subjected to a pretreatment comprising a number of steps including a step in which a preparatory metallic layer comprising titanium or chromium is deposited on a surface to form a base for the silver layer.

SUMMARY OF THE INVENTION

According to the present invention, we provide a process for the production of a carrier for surface plasmon resonance analysis (SPR) comprising:

depositing a layer of silver on a surface, the surface having been treated with an oxygen-containing gas to cause oxygen ions to enter the surface to an extent sufficient to sensitize it.

Also provided is a process for the production of a carrier for surface plasmon resonance (SPR) comprising:

A) treating a surface with an oxygen-containing gas to cause oxygen ions to enter the surface to an extent sufficient to sensitize it, and B) depositing a layer of silver on the treated surface.

DETAILED DESCRIPTION OF THE INVENTION

Figure 1:
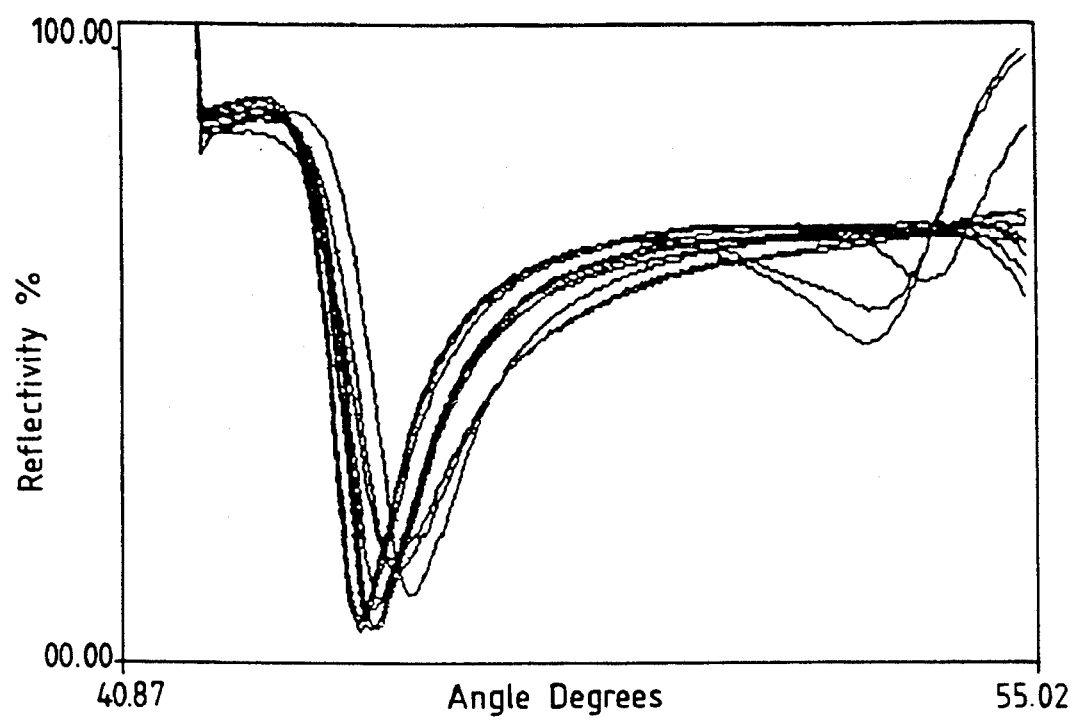
FIG. 1 relates to an air SPR of typically commercially available slides of approximately 421 Å gold (measured by optical density) with assay material removed from the gold surface.

A suitable pre-treatment comprises the steps of cleaning, followed by treatment with an oxygen-containing gas by the process of the invention. Thereafter, a metallic film may be deposited in two steps, a deposit of a lower preparatory layer followed by a deposit of an upper silver layer. After the silver layer has been deposited, the film is preferably annealed effectively in order to bake it and thereby orient it and enhance its physical properties.

Preferably the surface is a glass surface. Any suitable glass surface may be used but a preferred surface has a silicon dioxide surface layer. Particularly suitable types of glass are "PERMABLOC"™ and the earlier product "PERMASHEET"™ glass, both manufactured by Pilkington Glass of St. Helens, England. These have consistent top layers of silicon dioxide.

In the pre-treatment, the glass can be cleaned by treating with a freon and/or by ultrasonic treatment and thereafter with a vapor bath or blow drying.

After cleaning, the glass is subjected to treatment with an oxygen-containing gas according to the invention. Any suitable treatment may be used which will cause oxygen ions to enter the surface to an extent sufficient to sensitize it. Preferably the surface is subjected to a reactive glow discharge treatment which suitably uses a mixture of oxygen and an inert gas, in particular argon. The surface can be put into a vacuum system in a clean room environment. It may then be subjected to reactive glow discharge using a mixture of oxygen and a rare gas, i.e. a gas from Group 0 of the Periodic Table according to Mendeleev, containing suitably 5% to 15% oxygen. A preferred treatment uses a mixture of argon (90%) and oxygen (10%). The treatment time is suitably 1 to 5 minutes with 2 minutes being preferred. Prior to this procedure, the chamber is suitably pumped to a high vacuum. The organic vapor is suitably low or negligible.

When the surface has been treated by the process of the invention, a thin preparatory metallic layer is suitably deposited on the glass to form a base for the silver layer. This preparatory layer is suitably formed from titanium, nickel or chromium, nickel being preferred. It is suitably deposited using an electron beam source. Suitably, it has a thickness in the range 20 Å to 40 Å, preferably 20 Å to 30 Å and especially 25 Å to 30 Å.

The silver layer is deposited on the preparatory metallic layer, suitably soon and preferably immediately after the latter has been formed. Suitably the silver layer has a thickness in the range 500 Å to 600 Å, preferably 520 Å. This has been found to give the optimum SPR response. The deposit of the silver layer is suitably made at a low rate, being preferably at a rate between 0.5 Å and 5.0 Å per second and especially 1.0 Å per second.

After the silver layer has been deposited, an annealing step is preferably carried out. Suitably annealing is effected by infra red heating in a chamber. The preferred period is from 1.5 to 4 hours. The preferred temperature is in the range 125° to 175° C. A temperature of 150° C. is especially preferred. The annealing temperature is important when SPR is to be preferably at a rate between 0.5 Å and 5.0 Å per second and especially 1.0 Å per second.

After the silver layer has been deposited, an annealing step is preferably carried out. Suitably annealing is effected by infra red heating in a chamber. The preferred period is from 1.5 to 4 hours. The preferred temperature is in the range 125° to 175° C. A temperature of 150° C. is especially preferred. The annealing temperature is important when SPR is to be used to analyze the binding of antibodies. It is less important for analyzing the binding of compounds as dextran.

The annealing step is suitably carried out after the silver layer has been deposited preferably it is carried out immediately after the deposit of the silver layer but the presence of one or more intermediate layers is not precluded.

The invention is illustrated by the following example:

Example

A sheet of "PERMASHEET"™ glass obtained from Pilkingtons Glass, St. Helens, England was cleaned by ultrasonic treatment with a freon liquid, followed by freon vapor drying to eliminate streaking marks.

The cleaned sheet was then put into a vacuum system in a clean room environment and evacuated to approximately $10^{-7}$ m bar in an oil-free environment. It was then subjected to reactive glow discharge using a gaseous mixture comprising 90% argon and 10% oxygen for a 2 minute period. This was done by admitting a small amount of the gaseous mixture to the system and pumping at a pressure of 20 to 60 microns while applying a voltage of 300 V to an electrode for 2 minutes. As a result of this treatment, oxygen ions have sufficient energy to enter the surface of the glass and sensitize it. The equipment used was a Temescale 2550 coating system using a Telemark 4 crucible e-gun evaporator with Sycon controller.

After reactive glow discharge treatment, the system was repumped to approximately $10^{-7}$ m bar. Then a thin layer of nickel from a 99.9% pure ingot produced by Materials Research Corporation (MCR) was laid down upon the glass surface using an electron beam source. A typical beam current was 60 mÅ at 10 KeV energy. The layer was 25 Å to 30 Å in thickness. Deposition time was 25 to 30 seconds at 1 Å per second.

Immediately after the layer of nickel had been laid down, a layer of silver from a 99.9% pure ingot from MCR was laid upon it using the same technique. A typical beam current was 50 mÅ at 10 KeV. The silver layer was 520 Å in thickness. Deposition time was 8.5 minutes at 1 Å per second.

After deposit of the silver layer annealing was effected by placing the coated glass surface in a chamber and subjecting it to infra red heating at 150° C. for 4 hours.

The silver coated glass surface produced had a very suitable SPR response.

Figure 2:
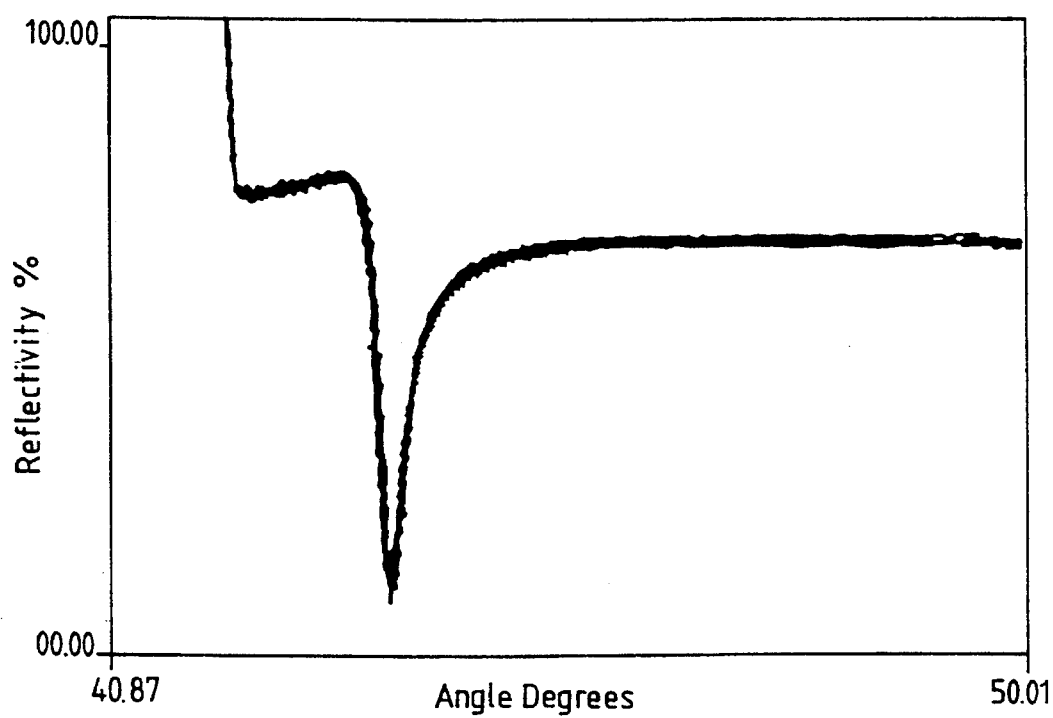
FIG. 2 relates to air SPR and to slides prepared by the process of the invention of approximately 560 Å silver with underlay measured by optical density.

This is illustrated by FIGS. 1 and 2 of the accompanying drawings wherein:

FIG. 1 is a graph of percentage light transmitted against angular position for a conventional commercially available SPR system; and FIG. 2 is a graph of percentage light transmitted against angular position for the system of the Example.

The Figures show that the characteristics produced by the Example are superior, giving a sharper, more distinct minimum in the curve.

The invention has been described in detail with particular reference to preferred embodiments thereof, but it will be understood that variations and modifications can be effected within the spirit and scope of the invention.

I claim:

1. A process for the production of a carrier for surface plasmon resonance analysis SPR comprising:

depositing a layer of silver on a surface, said surface having been treated with an oxygen-containing gas to cause oxygen ions to enter said surface.

2. The process of claim 1 wherein said oxygen-containing gas is a mixture of oxygen and a gas containing from 5% to 15% oxygen.

3. The process of claim 2 wherein said rare gas is argon.

4. The process of claim 1 wherein said surface has been treated by a reactive glow discharge treatment.

5. The process of claim 1 wherein said surface has been treated with an oxygen-containing gas for from 1 to 5 minutes.

6. The process of claim 1 wherein after depositing said silver layer, the carrier is subjected to an annealing step during which it is heated for from 1.5 to 4 hours.

7. The process of claim 6 wherein during said annealing step, said carrier is heated to a temperature of from 125° to 175° C.

8. The process of claim 1 wherein said surface is a silicon dioxide surface.

9. The process of claim 1 wherein a preparatory metallic layer comprising a major proportion of titanium, nickel or chromium is deposited on said treated surface before said silver layer is deposited.

10. The process of claim 9 wherein said preparatory metallic layer comprises nickel.

11. A process for the production of a carrier for surface plasmon resonance SPR comprising:

A) treating a surface with an oxygen-containing gas to cause oxygen ions to enter said surface, and B) depositing a layer of silver on said treated surface.

12. The process of claim 11 wherein a preparatory metallic layer comprising a major proportion of titanium, nickel or chromium is deposited on said treated surface prior to depositing said silver layer.

\* \* \* \* \*